(12) United States Patent
Moussaoui et al.

(10) Patent No.: US 8,400,134 B2
(45) Date of Patent: Mar. 19, 2013

(54) APPARATUS AND METHODOLOGY FOR MAXIMUM POWER POINT TRACKING FOR A SOLAR PANEL

(75) Inventors: Zaki Moussaoui, San Carlos, CA (US); Weihong Qiu, San Jose, CA (US); Jun Liu, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 302 days.

(21) Appl. No.: 12/716,654

(22) Filed: Mar. 3, 2010

(65) Prior Publication Data

US 2011/0109346 A1 May 12, 2011

Related U.S. Application Data

(60) Provisional application No. 61/260,438, filed on Nov. 12, 2009.

(51) Int. Cl.
*G05F 1/67* (2006.01)
*G05F 5/00* (2006.01)

(52) U.S. Cl. .......................... 323/288; 323/299; 320/101

(58) Field of Classification Search .................. 323/242, 323/288, 299, 313, 326, 906; 363/131; 320/101, 320/129, 139, 167
See application file for complete search history.

(56) References Cited

U.S. PATENT DOCUMENTS

| | | | | | |
|---|---|---|---|---|---|
| 3,566,143 | A | * | 2/1971 | Paine et al. | 307/126 |
| 5,801,519 | A | * | 9/1998 | Midya et al. | 323/222 |
| 6,111,767 | A | * | 8/2000 | Handleman | 363/95 |
| 6,339,538 | B1 | * | 1/2002 | Handleman | 363/95 |
| 6,590,793 | B1 | * | 7/2003 | Nagao et al. | 363/95 |
| 7,319,313 | B2 | * | 1/2008 | Dickerson et al. | 323/288 |
| 8,004,113 | B2 | * | 8/2011 | Sander et al. | 307/46 |
| 2009/0080226 | A1 | * | 3/2009 | Fornage | 363/74 |
| 2010/0171482 | A1 | * | 7/2010 | Ye et al. | 323/299 |
| 2010/0236612 | A1 | * | 9/2010 | Khajehoddin et al. | 136/252 |

OTHER PUBLICATIONS

Yen-Jung Mark Tung et al. "Evaluation of Micro Controller Based Maximum Power Point Tracking Methods Using dSPACE Platform," Australian University Power Engineering Conference 2006, 5 Pages.

\* cited by examiner

*Primary Examiner* — Gary L Laxton
(74) *Attorney, Agent, or Firm* — Fogg & Powers LLC

(57) ABSTRACT

Circuitry and methodology for tracking the maximum power point (MPP) of a solar panel is disclosed. The voltage and current generated by the solar panel are monitored and used to generate a pulse signal for charging a capacitor. The changes in the voltage and current generated by the solar panel are also monitored, and that information is used to generate a pulse signal for discharging the capacitor. The charging and the discharging pulse signals are used to charge and discharge the capacitor. A reference signal indicative of the charge level of the capacitor is generated. As the current and voltage generated by the solar panel approach the maximum power point (MPP), the frequency of the discharging pulse signal becomes progressively higher, so that the capacitor charging occurs in progressively smaller increments. When the MPP is reached, the reference signal level becomes steady because the charge level of the capacitor becomes steady.

23 Claims, 9 Drawing Sheets

APPARATUS AND METHODOLOGY FOR MAXIMUM POWER POINT TRACKING FOR A SOLAR PANEL

CROSS-REFERENCE TO RELATED APPLICATIONS

This application claims priority from U.S. Provisional Patent Application No. 61/260,438, filed Nov. 12, 2009 and entitled FAST RESPONSE MAXIMUM POWER TRACKER, which is incorporated herein by reference.

BRIEF DESCRIPTION OF THE DRAWINGS

The objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
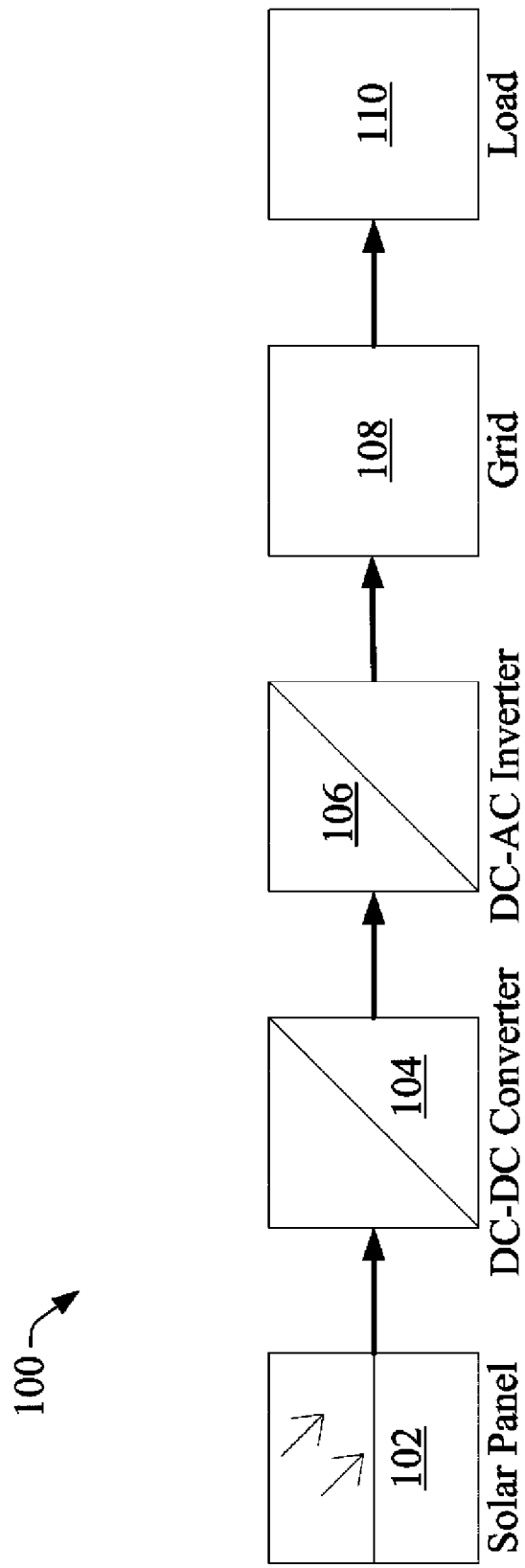
FIG. 1 illustrates an exemplary block diagram for a power system according to an embodiment of the present invention.

The embodiments of the present invention relate to methodology and apparatus for tracking the maximum power point (MPP) of a solar panel, and operating the solar panel at the MPP. The embodiments of the present invention are elegant and provide fast conversion time and accurate tracking without requiring software or complex system(s) for processing mathematical equations or algorithm. The claimed subject matter is described with reference to the drawings, wherein like reference numerals are used to refer to like elements throughout. In the following description, for purposes of explanation, numerous specific details and examples are set forth in order to provide a thorough understanding of the embodiments of the present invention.

One having ordinary skill in the art will understand that the embodiments of the present invention may be practiced without these specific details and are not limited by these specific details and examples. One having ordinary skill in the art will also appreciate that well-known structures and devices are shown in block diagram form in order to facilitate describing the claimed subject matter. Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. Also, the word "coupled" is used herein to mean direct or indirect electrical or mechanical coupling.

FIG. 1 illustrates an exemplary block diagram for a system 100 in which the circuitry and methodology of for an embodiment of the present invention are implemented. The system 100 includes a solar panel 102 that receives sunlight and generates voltage (V) and current (I). The solar panel 102 is coupled to the DC-DC converter 104. A DC-DC converter 104 is an electronic circuit which converts a source of direct current (DC) from one voltage level to another. To deliver the maximum amount of power to a load, the DC-DC converter 104 is placed between the solar panel 102 and the load 110, to match the impedance of the panel 102 to the load 110. Impedance matching is the electronics design practice of setting the input impedance of an electrical load equal to the output impedance of the electrical source to which it is coupled, usually in order to maximize the power transfer and minimize reflections from the load.

DC-DC converter 104 includes circuitry that generates a reference signal indicative of the MPP and the DC-DC converter 104 and uses the reference signal to track the MPP and perform impedance matching for the load 110. The DC-DC converter 104 is coupled to the DC-AC inverter 106, which, in turn, is coupled to the power grid 108. A DC-AC inverter is a device that converts direct current (DC) into alternating current (AC). A power grid can include a number of power lines, transformers, and associated equipment employed in distributing electricity over a geographical area. The load 110 can include any device that uses electricity including an industrial load, a commercial device, a home appliance, and the like.

Figure 2:
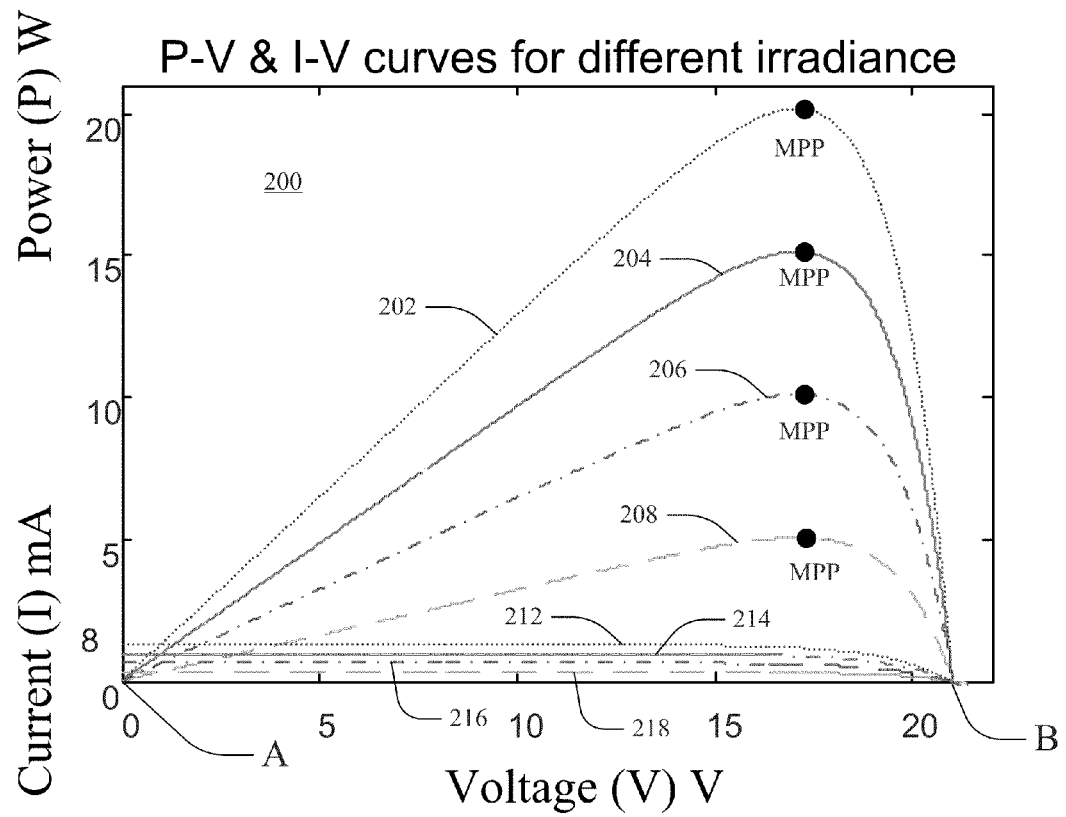
FIG. 2 illustrates exemplary I-V (current-voltage) and P-V (power-voltage) curves for a solar panel.

Solar panels capture sunlight and convert it into electricity using photovoltaic (PV) cells. FIG. 2 illustrates P-V (power-voltage) curves and I-V (current-voltage) curves at various solar radiation levels for an exemplary solar panel, according to an embodiment of the present invention. According to the exemplary graph 200, the voltage generated by the solar panel ranges from 0 to around 22 volts, the current generated by the solar panel ranges from 0 to around 800 milliamperes, and power generated by the solar panel ranges from 0 to around 20 watts. As can be observed from the exemplary I-V curves 212, 214, 216 and 218, the solar panel provides maximum current at point A, i.e. at 0 volts (or short circuit voltage). The exemplary I-V curves 212, 214, 216 and 218 also illustrate that the solar panel provides zero current at point B, i.e. at around 22 volts (or open circuit voltage). The solar panel current level for each I-V curve 212, 214, 216 or 218 becomes progressively less as the solar panel voltage rises from short circuit voltage to open circuit voltage.

The curve 212 represents a higher solar radiance than the curve 214, the curve 214 represents a higher solar radiance than the curve 216, and the curve 216 represents a higher solar radiation than the curve 218. The graph 200 also illustrates the MPPs for the I-V curves 212, 214, 216 and 218. As can be seen from FIG. 2, the voltage at the MPP generally stays about the same, but the current at the MPP increases with increasing radiation. The current at the MPP also increases with decreased temperature. The following equations describe the I-V curve 212, 214, 216 or 218: to the left of MPP, $\Delta I/\Delta V > -I/V$; at the MPP, $\Delta I/\Delta V = -I/V$, and to the right of MPP, $\Delta I/\Delta V > -I/V$, wherein $\Delta I/\Delta V$ represents change in current divided by change in voltage and $I/V$ represents current divided by voltage.

The graph 200 also illustrates the P-V curves 202, 204, 206 and 208. The P-V curve 202 is associated with the I-V curve 212, the P-V curve 204 is associated with the I-V curve 214, the P-V curve 206 is associated with the I-V curve 216, and the P-V curve 208 is associated with the I-V curve 218. The solar panel generates maximum power when the voltage is at the maximum power point ($V_{MPP}$). The slope of the P-V curve 202, 204, 206 or 208 is zero (i.e. the curve is flat) when the voltage level of the solar panel is at the $V_{MPP}$, is positive (i.e. the curve is rising) when the voltage level of the solar panel is below the $V_{MPP}$, and is negative (i.e. the curve is falling) when the voltage level of the solar panel is above the $V_{MPP}$. The curve 202 represents a higher solar radiance level than the curve 204, the curve 204 represents a higher solar radiance level than the curve 206, and the curve 206 represents a higher solar radiance level than the curve 208.

Figure 3:
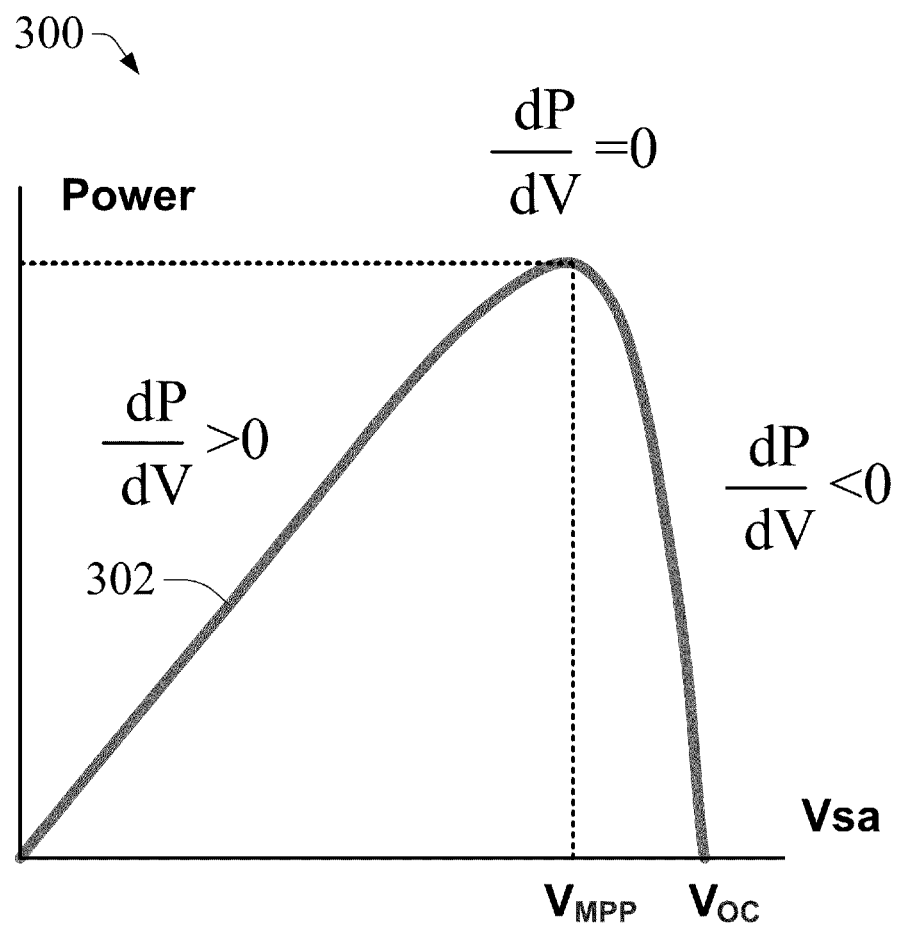
FIG. 3 illustrates an exemplary P-V curve for a solar panel.

MPP can be described as the point on the P-V curve where the slope of the curve is zero. As can be seen from the graph 300 in FIG. 3, on the left side of the curve 302, i.e. to the left of MPP, the slope of the curve 302 is greater than zero, i.e. dP/dV>0, wherein P represents power, V represents voltage, and dP/dV represents the derivative of P with respect to V. On the right side of the curve 302, i.e. to the right of the MPP, the slope is less than zero, i.e. dP/dV<0. At the MPP, the slope of the curve 302 is equal to zero, i.e. dP/dV=0. Voltages larger than the solar panel's open circuit voltage $V_{OC}$ are referred to as saturation voltages ($V_{sa}$), and no current or power is associated with the saturation voltages ($V_{sa}$).

Figure 4:
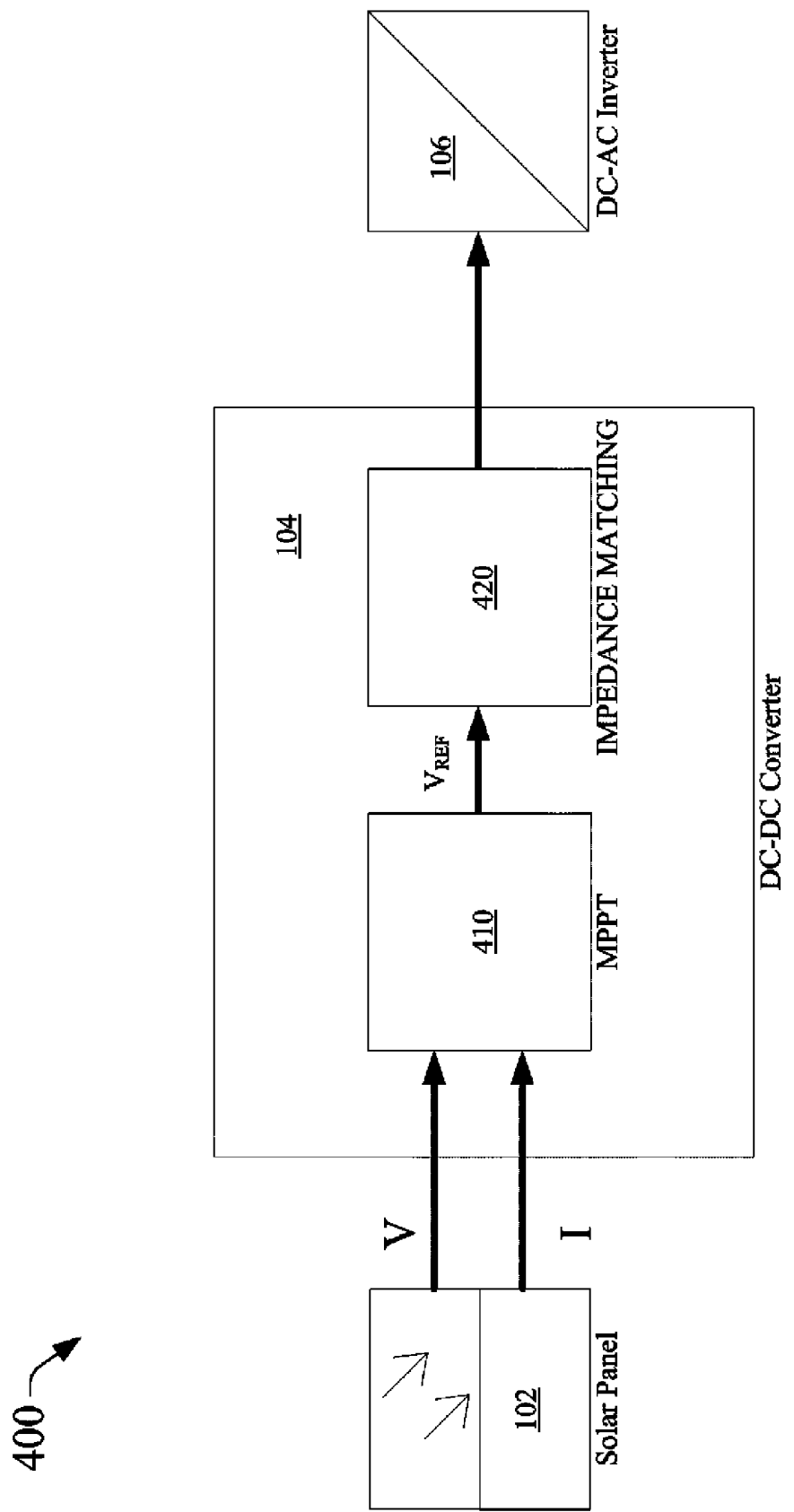
FIG. 4 illustrates exemplary high level functional blocks of the DC-DC Converter, according to an embodiment of the present invention.

FIG. 4 illustrates an exemplary functional block diagram for an embodiment of the present invention. The system 400 is shown, which includes the solar panel 102 coupled to the DC-DC Converter 104, which is coupled to the DC-AC Inverter 106. The DC-DC Converter 104 includes the MPPT module 410 coupled to the Impedance Matching module 420. The MPPT module 410 receives the V and I signals that are representative of the voltage (V) and the current (I) generated by the solar panel 102. The MPPT 410 generates the $V_{REF}$ signal, which is indicative of the MPP. The Impedance Matching module 420 receives the $V_{REF}$ signal and uses it to perform impedance matching. The Impedance Matching module 420 can also provide information, including the $V_{REF}$ signal, to the AC-DC Inverter 106, and the AC-DC Inverter can use that information to perform the impedance matching.

Figure 5:
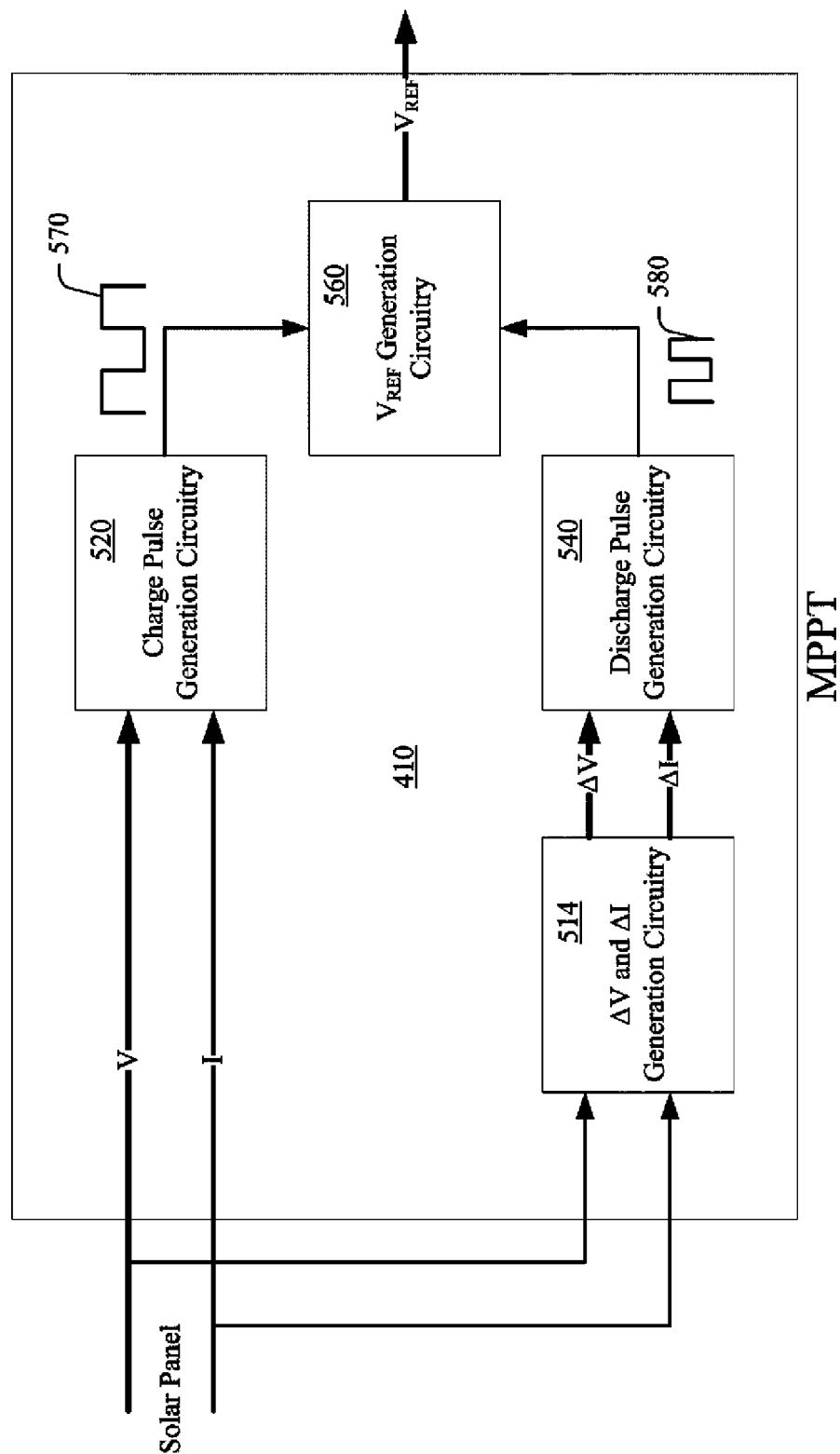
FIG. 5 illustrates exemplary high level functional blocks of the maximum power point tracker (MPPT), according to an embodiment of the present invention.

FIG. 5 illustrates an exemplary functional block diagram for an embodiment of the MPPT circuitry. The solar panel 102 is coupled to the MPPT module 410, which generates the $V_{REF}$ reference signal. The solar panel 102 provides the MTTP module 410 with signals indicative of the voltage and current generated by the solar panel 102. MPPT module 410 includes the Charge Pulse Generation Circuitry 520 coupled to the $V_{REF}$ Generation Circuitry 560. The MPPT module 410 also includes the ΔV and ΔI Generation Circuitry 514 coupled to the Discharge Pulse Generation Circuitry 540, which, in turn, is coupled to the $V_{REF}$ Generation Circuitry 560. The Charge Pulse Generation Circuitry 520 receives the V (voltage) and I (current) signals from the solar panel and uses them to generate the charge pulse 570. The ΔV and ΔI Generation Circuitry 514 receives the V (voltage) and I (current) signals from the solar panel and uses them to generate the ΔV and ΔI signals. The ΔV signal is indicative of the change in V and the ΔI signal is indicative of the change in I. The Discharge Pulse Generation Circuitry 540 receives the ΔV and ΔI signals and uses them to generate the discharge pulse 580. The $V_{REF}$ Generation Circuitry 560 receives the charge pulse 570 and the discharge pulse 580 and uses them to generate the $V_{REF}$ signal.

Figure 6:
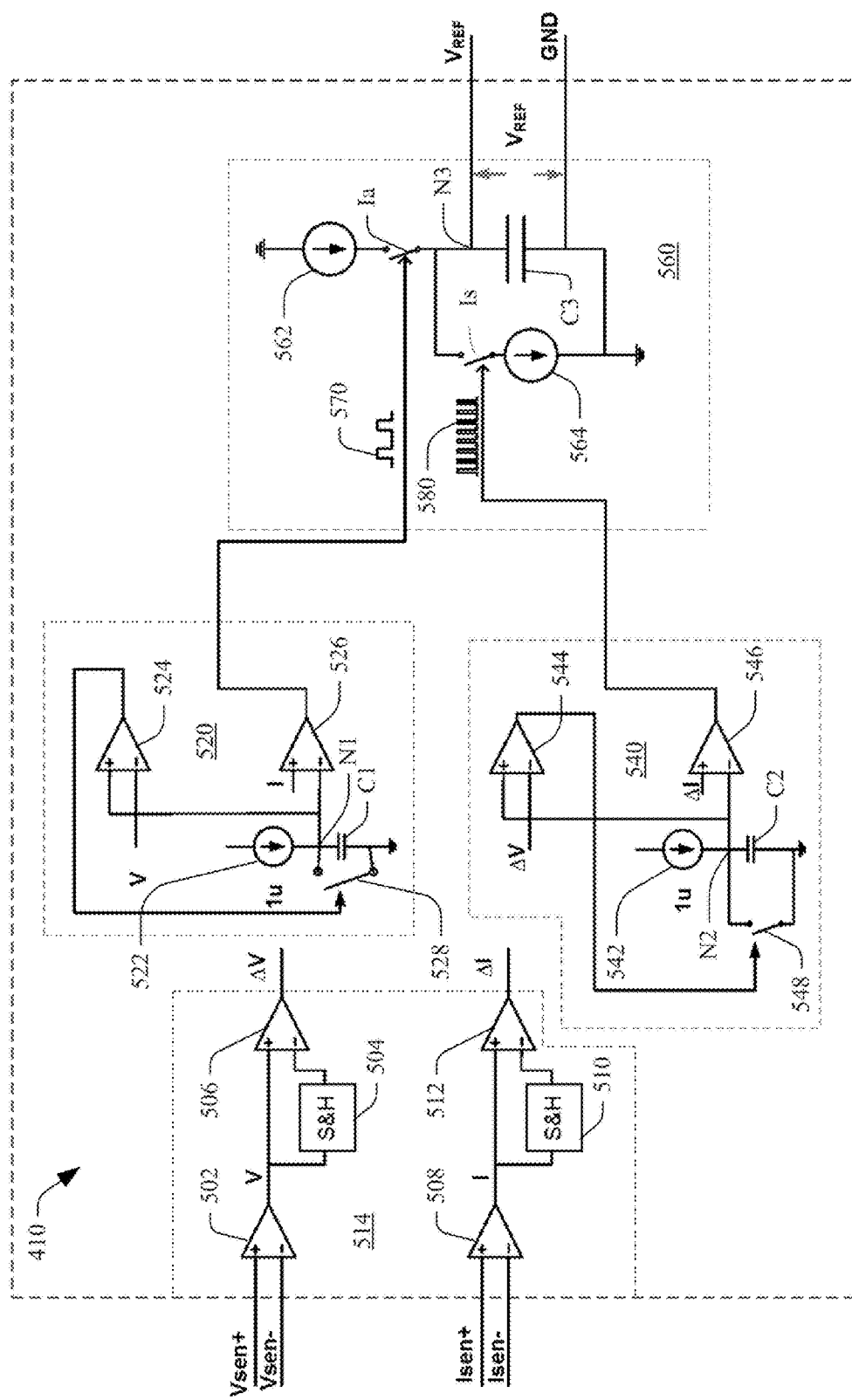
FIG. 6 illustrates exemplary circuitry and signals of the MPPT, according to an embodiment of the present invention.

FIG. 6 illustrates a detailed functional block diagram for an embodiment of the MPPT circuitry. The MPPT circuitry 410 can be implemented in a mixed signal power integrated circuit chip (IC) for a DC-DC converter 104. The MPPT circuitry 410 includes the ΔV and ΔI Generation Circuitry 514 having a comparator 502 coupled to the output voltage of a solar panel 102. The solar panel 102 and the DC-to-DC converter 104 that includes the MPPT circuitry 410 can both be coupled to a common ground, such that the comparator 502 and the solar panel 102 are coupled to a common ground. The two input pins of the comparator 502 can be coupled to the positive (Vsen+) and the negative (Vsen−) DC voltage output terminals of the solar panel 102. The output of the comparator 502 can be representative of the solar panel's 102 output voltage level V. The comparator 502 can compare either the Vsen+ or the Vsen− voltage signal received from the solar panel 102 with zero (or ground) and provide an output signal that is representative of the solar panel's 102 output voltage level V.

The ΔV and ΔI Generation Circuitry 514 also includes a comparator 508 coupled to the output current of the solar panel 102. The solar panel 102 and the DC-to-DC converter 104 that includes the MPPT circuitry 410 can be coupled to a common ground, such that the comparator 508 and the solar panel 102 are coupled to a common ground. The two input pins of the comparator 508 can be coupled to the positive (Isen+) and negative (Isen−) DC current output terminals of the solar panel 102. Thus, the solar panel includes four output terminals: Vsen+, Vsen−, Isen+ and Isen−. The output of the comparator 508 can be representative of the solar panel's 102 output current level I. The comparator 508 can compare either the Isen+ or the Isen− current signal received from the solar panel 102 with zero (or ground) and provide an output signal that is representative of the solar panel's 102 output current level I.

The ΔV and ΔI Generation Circuitry 514 includes sample-and-hold (S-and-H) circuits 504 and 510. S-and-H circuit is a circuit that measures an input signal at a series of definite times, and whose output remains constant at a value corresponding to the most recent measurement until the next measurement is made. The S-and-H circuits 504 and 510 can include analog circuits that use capacitors for storage. A capacitor is an electronic device used for accumulating and holding a charge of electricity. The inputs of the comparator 506 are coupled to the output of the comparator 502 and the output of the S&H circuit 504. The output of the comparator 506 includes a signal indicative of the change in the solar panel's 102 output voltage ΔV. The inputs of the comparator 512 are coupled to the output of the comparator 508 and the output of the S&H circuit 510. The output of the comparator 512 includes a signal indicative of the change in the solar panel's 102 output current ΔI. Thus, the comparators 506 and 512 are used to monitor the change in the solar panel's 102 output voltage and current respectively.

The outputs of the comparator 502 and the comparator 508, namely V and I respectively, are provided as inputs to the capacitor charging circuit 520. Circuit 520 is referred to as the capacitor charging circuit because it generates the charging pulse 570 that is used for charging the capacitor C3. A pulse or a pulse signal can be described as a signal having a rapid, transient change in the amplitude of the signal from a baseline value to a higher or lower value, followed by a rapid return to the baseline value. A pulse generally alternates between an "on" state (also referred to as "high") and an "off" state (also referred to as "low.") The outputs of the comparator 506 and the comparator 512, namely ΔV and ΔI respectively, are provided as inputs to the capacitor discharging circuit 540. Circuit 540 is referred to as the capacitor discharging circuit 540 because it generates the discharging pulse 580 that is used for discharging the capacitor C3.

The capacitor charging circuit 520 includes the current source 522, the capacitor C1 and the comparator 524 for generating a ramp waveform. A current source is an electrical or electronic device that delivers electric current. The current source 522 can charge the capacitor C1 with a constant current of, for example, one microamperes (1 μA). A ramp waveform can also be referred to as a saw tooth waveform and can be described as a waveform that increases linearly with time for a fixed interval, returns abruptly to the original level, and repeats the process periodically, producing a shape resembling the teeth on the blade of a saw.

The capacitor C1 is coupled to the current source 522 and the ground. A person having ordinary skill in the art would appreciate that as the current from the current source 522 charges the capacitor C1, the voltage at node N1 would become progressively higher. The voltage at node N1 is provided as an input to the comparator 524. The comparator 524 thus receives a voltage ramp signal as an input. The other input of comparator 524 is the output of the comparator 502, namely, the voltage signal (V), which is indicative of the solar panel's 102 output voltage level. The output of the comparator 524 is coupled to the switch 528. When the voltage ramp signal level generated at the node N1 exceeds the voltage signal V level, the output of the comparator 524 activates the switch 528, thereby causing a short circuit between the current source 522 and the ground.

The short circuit condition causes the capacitor C1 to discharge completely, thereby causing the voltage level at node N1 to drop to zero. That, in turn, causes the comparator 524 to deactivate the switch 528 and the capacitor C1 is charged again to generate the voltage ramp signal at node N1. This process is continuously repeated to generate the voltage ramp waveform. The current source 522, the capacitor C1, the comparator 524 and the switch 528 can be cumulatively referred to as the voltage ramp waveform generation circuitry. The embodiment of FIG. 6 can be practiced with other types of voltage ramp waveform generators.

Node N1 is also coupled to the input of the comparator 526. So, the comparator 526 also receives the voltage ramp waveform generated at the node N1 as an input signal. The voltage ramp waveform generated at the node N1 can also be referred to as the voltage peak ramp because its peak value is equal to the level of the voltage V, as discussed above. The other input to the comparator 526 is the output of the comparator 508, namely the voltage I, which is indicative of the sensed voltage corresponding to the current generated by the solar panel 102. The output of the comparator 526, which is provided as an input to the $V_{REF}$ generation circuitry 560, is illustrated in FIG. 7a.

Figure 7A:
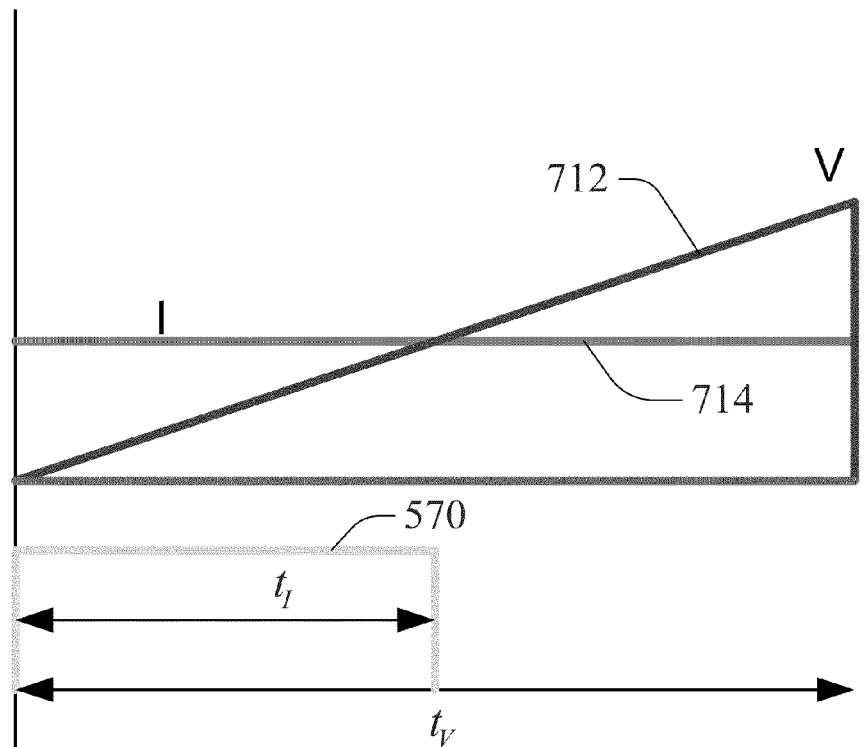
FIGS. 7a and 7b illustrate exemplary waveforms generated by the MPPT, according to an embodiment of the present invention.

As can be seen in FIG. 7a, the comparator 526 generates the capacitor charging pulse 570 by comparing the voltage peak ramp 712 with the current I 714. The pulse 570 is HIGH when the voltage peak ramp 712 is below the current I 714. The pulse 570 is LOW when the voltage peak ramp 712 is above the current I 714. As can be seen in FIG. 7a, the pulse 570 is "on" or "HIGH" for the period $t_I$. The period $t_I$ begins when V is zero and ends when V exceeds I (at $t_V$). The length of the "on" or "HIGH" state of the pulse 570 can also be referred to as the pulse width of the pulse 570. The pulse width of the pulse 570 is directly proportional to the current level 714. In other words, the pulse width of the pulse 570 would be larger for a higher current level 714 than for a lower current level 714. While FIG. 7a depicts only one cycle of pulse 570 for illustration purposes, continuous cycles of the pulse 570 are generated.

The capacitor discharging circuit 540 includes the current source 542, the capacitor C2 and the comparator 544 for generating a ramp waveform. The current source 542 can charge the capacitor C2 with a constant current of, for example, one microamperes (1 μA). The capacitor C2 is coupled to the current source 542 and the ground. A person having ordinary skill in the art would appreciate that as the current from the current source 542 charges the capacitor C2, the voltage at node N2 would become progressively higher. The voltage at node N2 is provided as an input to the comparator 544. The comparator 544 thus receives a voltage ramp signal as an input. The other input of comparator 544 is the output of the comparator 508, namely the change in voltage signal ΔV, which is indicative of the change in the solar panel's 102 output voltage level. The output of the comparator 544 is coupled to the switch 548. When the voltage ramp signal level generated at the node N2 exceeds the change in voltage signal ΔV level, the output of the comparator 544 activates the switch 548, thereby causing a short circuit between the current source 542 and the ground.

The short circuit condition causes the capacitor C2 to discharge completely, thereby causing the voltage level at node N2 to drop to zero. That, in turn, causes the comparator 544 to deactivate the switch 548 and the capacitor C2 is charged again to generate the voltage ramp signal at node N2. This process is continuously repeated to generate the voltage ramp waveform. The current source 542, the capacitor C2, the comparator 544 and the switch 548 can be cumulatively referred to as the voltage ramp waveform generation circuitry. The embodiment of FIG. 6 can be practiced with other types of voltage ramp waveform generators.

Node N2 is also coupled to the input of the comparator 546. So, the comparator 546 also receives the voltage ramp waveform generated at the node N2 as an input signal. The voltage ramp waveform generated at the node N2 can also be referred to as the change in voltage peak ramp because its peak value is equal to the level of the change in voltage signal ΔV, as discussed above. The other input to the comparator 546 is the output of the comparator 512, namely the change in sensed current ΔI, which is indicative of the change in the current generated by the solar panel 102. The output of the comparator 546, which is provided as an input to the $V_{REF}$ generation circuitry 560, is illustrated in FIG. 7b.

Figure 7B:
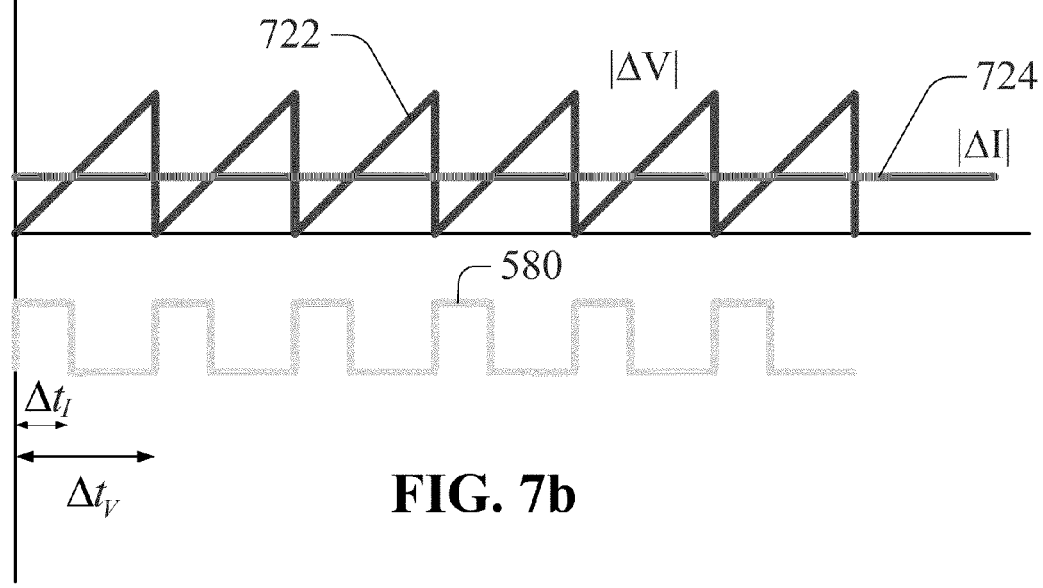

As can be seen in FIG. 7b, the comparator 546 generates the capacitor discharging pulse 580 by comparing the change in voltage ΔV peak ramp 722 with the change in current ΔI 724. The pulse 580 is HIGH when the ΔV peak ramp 722 is below the ΔI signal level 724. The pulse 580 is LOW when the ΔV peak ramp 722 is above the ΔI signal level 724. As can be seen in FIG. 9b, the pulse 580 is "on" or "HIGH" for the period $t_{ΔI}$. The period $t_{ΔI}$ begins when V is zero and ends when ΔV exceeds ΔI (at $t_{ΔV}$). The length of the "on" or "HIGH" state of the pulse 580 can also be referred to as the pulse width of the pulse 580. The pulse width of the pulse 580 is directly proportional to the ΔI level 724. In other words, the pulse width of the pulse 580 would be larger for a higher ΔI level 724 than for a lower ΔI level 724.

The $V_{REF}$ generation circuitry 560 receives the capacitor charging pulse 570 from the circuitry 520 and the capacitor discharging pulse 580 from the circuitry 540. When the pulse 570 is HIGH, the switch $I_a$ is activated (or ON). When the switch $I_a$ is activated, the current source 562 charges the capacitor C3. As the capacitor C3 is charged, the voltage at the node N3 becomes progressively high. The capacitor C3 is electrically coupled to a voltage reference $V_{REF}$, which is an input to the Impedance Matching Module 420 of the DC-DC converter 104, by way of the node N3. The voltage at the node N3 can be also referred to as $V_{REF}$. When the pulse 570 is LOW, the switch $I_a$ is deactivated (or OFF). When the switch $I_a$ is deactivated, no charging of device capacitor C3 through switch $I_a$ is performed. When the voltage peak ramp 712 crosses the current 714, the switch $I_a$ is toggled to the opposite value (i.e. from OFF to ON, or from ON to OFF).

The $V_{REF}$ generation circuitry 560 also receives the capacitor discharging pulse 580 from the circuitry 540. When the pulse 580 is HIGH, the switch $I_s$ is activated (or ON). When the switch $I_s$ is activated, the current source 564 causes the device capacitor C3 to be incrementally discharged through the switch $I_s$. As the capacitor C3 is discharged, the voltage at the node N3 ($V_{REF}$) becomes progressively lower. When pulse 580 is LOW, the switch $I_s$ is deactivated (or OFF) and device capacitor C3 is not discharged. When the change in voltage peak ramp 722 crosses the change in current 724, switch $I_s$ is toggled to the opposite value (i.e. from OFF to ON, or from ON to OFF).

The teachings of the present invention are based on two observations. One is that the current and the voltage generated by the solar panel change in different directions. The other observation is that an adaptive $\Delta V$ and $\Delta I$ can be used in order to approximate the MPPT and to remain there. As the voltage V and current I approach the MPP point, the $\Delta V$ and $\Delta I$ increments will decrease to provide smaller steps so that current I and voltage V do not exceed the MPP point during the succeeding iteration. In practical terms, as the MPP is approached, the decrease in $\Delta V$ and $\Delta I$ increments will result in a progressively higher frequency of the discharging pulse signal 580, which in turn, would result in an increased discharging of the capacitor C3, thereby lowering the increments by which the capacitor C3 charge is increasing. At the MPP, the charge added to the capacitor C3 as a result of the I/V ratio relationship is the same as the charge removed from the capacitor C3 as a result of the $\Delta I/\Delta V$ ratio relationship.

Furthermore, in order for the load to be configured in proximity to the MPP point and remain there, an adaptive change in voltage (i.e. "$\Delta V$" or "Delta V") and change in current (i.e. "$\Delta I$" or "delta I") is useful because it provides both a fast conversion time and accurate tracking. To ensure that the MPP point has been reached, dP/dV should equal 0, and thus it follows that dI/dV=−I/V. Because I/V is larger than dI/dV, the switch $I_a$ controlling the current source 562 will be turned on more than the switch $I_s$ controlling the current source 564. Thus, the charge on the capacitor C3 will increase, which will increase the reference voltage level $V_{REF}$ of the DC-DC converter used to match the load impedance. When dI/dV=I/V, the change on the capacitor C3 will be zero because the charging of C3 by the current source 562 and the switch $I_a$ will be equal to the simultaneous discharging of C3 by the current source 564 and the switch $I_s$. When that happens, a steady state condition and the desired MPP point will have been reached.

Figure 8:
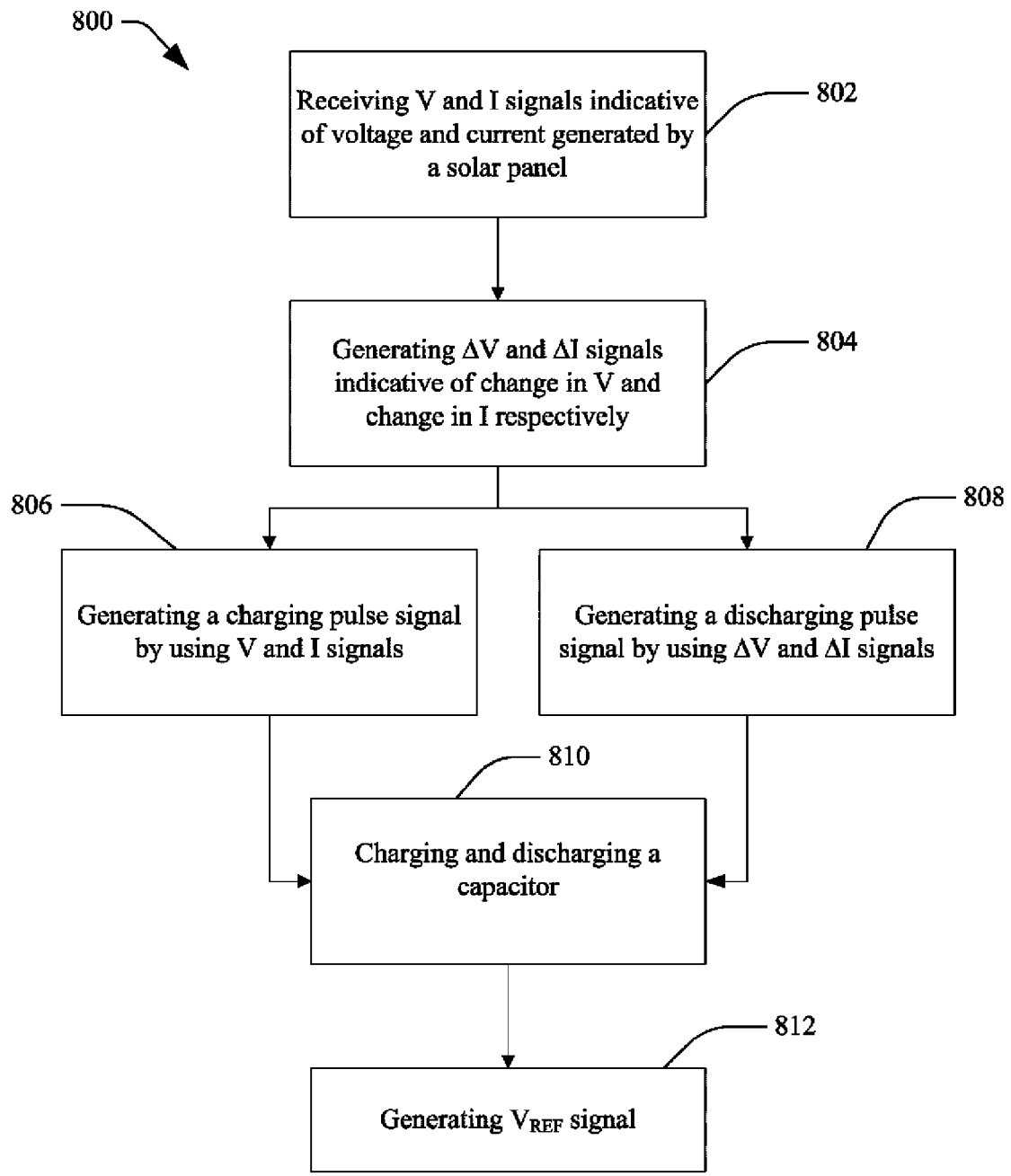
FIG. 8 illustrates an exemplary methodology, according to an embodiment of the present invention.

FIG. 8 illustrates an exemplary flow diagram for the methodology of an embodiment of the present invention. According to the flow diagram 800, at Step 802, V and I signals indicative of the voltage and current generated by the solar panel are received. At Step 804, the V and I signals are used to determine the $\Delta V$ and $\Delta I$ signals, wherein $\Delta V$ represent change in V and $\Delta I$ represents change in I. At Step 806, a charging pulse signal is generated by using the V and I signals. At Step 808, a discharging pulse signal is generated by using the $\Delta V$ and $\Delta I$ signals. At Step 810, the charging pulse is used to charge a capacitor and the discharging pulse is used to discharge the capacitor. At Step 812, a reference signal indicative of the charge level of the capacitor is generated.

Figure 9:
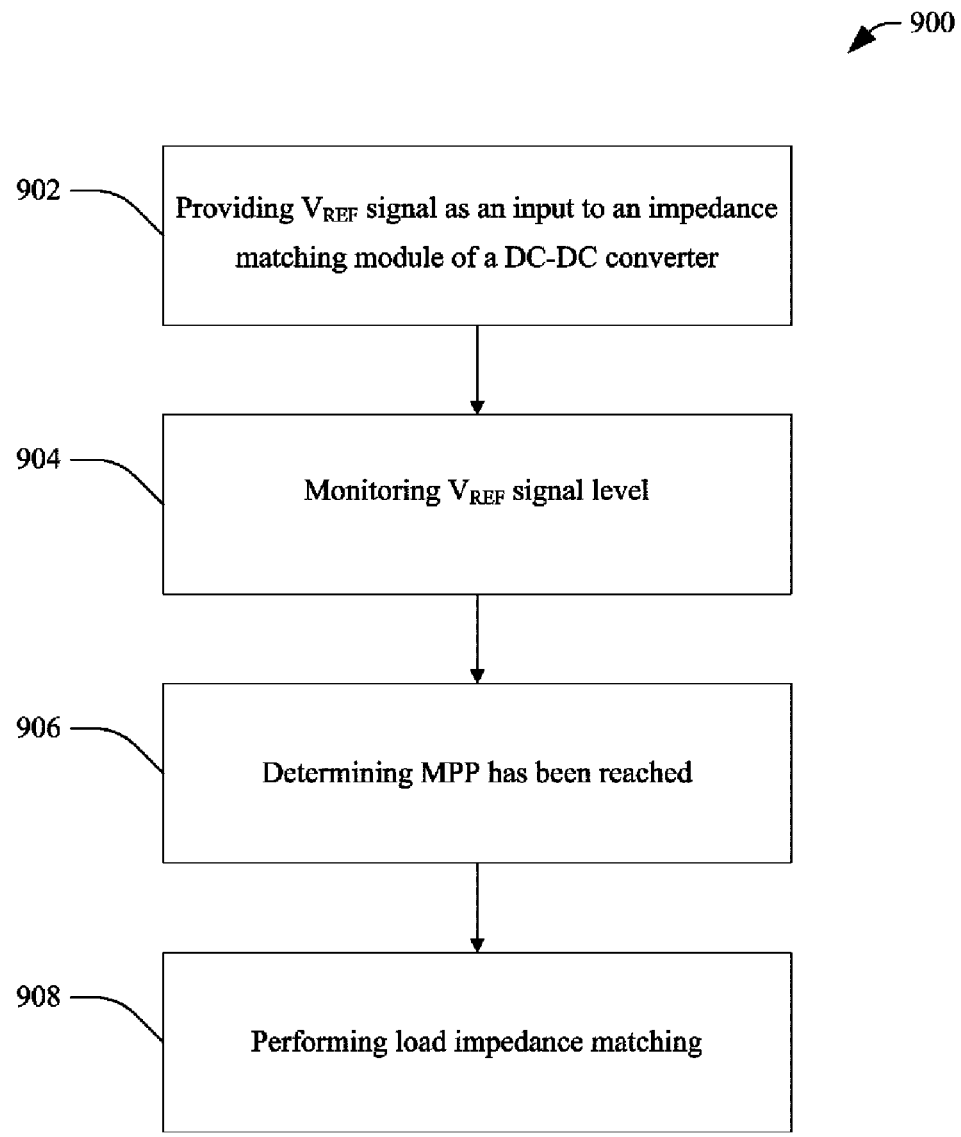
FIG. 9 illustrates another exemplary methodology, according to an embodiment of the present invention.

FIG. 9 illustrates another flow diagram for the methodology of an embodiment of the present invention. According to the flow diagram 900, at Step 902 the reference signal generated in FIG. 8 is provided as an input to the impedance matching module of the DC-DC converter. At Step 904, the impedance matching module monitors the level of the reference signal. At Step 906, the impedance matching module determines if the MPP has been reached. The MPP is reached when the reference signal level is steady, which happens when the amount of charge being added to the capacitor is the same as the amount of charge being removed from the capacitor, thereby maintaining the charge level of the capacitor at a steady level.

The capacitor is charged and discharged by using the charging and discharging pulse signals discussed above. As the MPP approaches, the $\Delta V$ and $\Delta I$ signal levels become progressively small, which in turn causes the frequency of the discharging pulse signal to increase. As the frequency of the discharging pulse increases, the capacitor is discharged more, even if the pulse width of the charging pulse signal is larger than the pulse width of the discharging pulse signal. That causes a decrease in the increment by which the charge level of the capacitor is increased, because of the charging of the capacitor caused by the charging pulse signal. At Step 908, the reference signal is used to perform an impedance matching of the load, such that the load is set to operate at or near the MPP.

In the following, mathematical proof is provided for the methodology practiced by the embodiments of the present invention. The following equations 1-3 are used for determining the instantaneous voltage of a capacitor, for example, capacitor C3 in FIG. 8. A person having ordinary skill in the art would appreciate that according to equations 1-3, the instantaneous capacitor voltage $V_C$ is a factor of the initial voltage across the capacitor $V_C(0)$, the charge added to the capacitor and the charge removed from the capacitor. In equations 1-3, C represents the capacitance value of the capacitor, $\int$ represents integral, V represents voltage, and I represents current. Several other terms have been previously described, for example, with references to FIGS. 9a and 9b. n represents the number of times the duration $t_{\Delta I}$ can occur during an occurrence of $t_I$. So, for example, if $t_I$ represents 4 milliseconds and $t_{\Delta I}$ represents 1 millisecond, then n would be 4.

$$V_c = V_c(0) + \frac{1}{C}\int_0^{t_V} I_I(t)\,dt - \frac{1}{C}\int_0^{t_V} I_{\Delta I}\,dt \qquad \text{Eq. 1}$$

$$= V_c(0) + \frac{1}{C}\int_0^{t_I} I\,dt - \frac{n}{c}\int_0^{t_{\Delta I}} I\,dt \qquad \text{Eq. 2}$$

$$= V_c(0) + \frac{I}{C}(t_1 - nt_{\Delta I}) \qquad \text{Eq. 3}$$

The following equations 4 and 5 illustrate that the slope (S) of the V and $\Delta V$ are the same.

$$S = \frac{I}{t_I} = \frac{V}{t_V} \Rightarrow \frac{I}{V} = \frac{t_I}{t_V} \Leftrightarrow \frac{I \cdot t_V}{V} = t_I \qquad \text{Eq. 4}$$

$$S = \frac{|\Delta I|}{\Delta t_I} = \frac{|\Delta V|}{\Delta t_V} \Rightarrow \left|\frac{\Delta I}{\Delta V}\right| = \frac{t_{\Delta I}}{t_{\Delta V}} \Leftrightarrow \frac{|\Delta I| \cdot t_V}{n|\Delta V|} = t_{\Delta I} \qquad \text{Eq. 5}$$

Thus, it follows that:

$$V_c = V_c(0) + \frac{I}{C}(t_1 - nt_{\Delta I}) \qquad \text{Eq. 6}$$

$$= V_c(0) + \frac{I}{C}\left(\frac{I \cdot t_V}{V} - \frac{|\Delta I| \cdot t_V}{|\Delta V|}\right) \qquad \text{Eq. 7}$$

$$= V_c(0) + \frac{It_V}{C}\left(\frac{I}{V} - \frac{|\Delta I|}{|\Delta V|}\right) \qquad \text{Eq. 8}$$

Furthermore, ΔV and ΔI are never in the same direction, so:

$$\frac{|\Delta I|}{|\Delta V|} = -\frac{\Delta I}{\Delta V} \quad \text{Eq. 9}$$

and:

$$V_c = V_c(0) + \frac{It_V}{C}\left(\frac{I}{V} + \frac{\Delta I}{\Delta V}\right) \Leftrightarrow \quad \text{Eq. 10}$$

$$V_c = V_c(0) + \frac{\Delta P}{\Delta V} \quad \text{Eq. 11}$$

Therefore, if the two pulse energies (charging and discharging energies) cancel each other, then the MPPT has been reached:

$$\frac{\Delta P}{\Delta V} = 0 \quad \text{Eq. 11}$$

and $$V_c = V_c(0) \quad \text{Eq. 12}$$

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising."

Moreover, one or more aspects of the above described embodiments may be implemented in or across a plurality of chips or devices. Therefore, the present invention should not be limited to any single embodiment, but rather should be construed in breadth and scope in accordance with the appended claims. Also, in view of the exemplary systems described supra, methodologies that may be implemented in accordance with the disclosed subject matter will be better appreciated with reference to the flowcharts of the various figures. While for purposes of simplicity of explanation, the methodologies are shown and described as a series of blocks or steps, it is to be understood and appreciated that the claimed subject matter is not limited by the order of the steps, as some steps may occur in different orders and/or concurrently with other steps from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated steps may be required to implement the methodologies described hereinafter.

What is claimed is:

1. A circuit for tracking a maximum power point (MPP) for a solar panel, comprising:
   first and second pulse generation components coupled to a capacitor; wherein,
   the first pulse generation component for generating a pulse signal for charging the capacitor based on the voltage and current generated by the solar panel;
   the second pulse generation component for generating a pulse signal for discharging the capacitor based on the change in voltage and current generated by the solar panel; and
   the capacitor for generating a signal indicative of the MPP for the solar panel.

2. The circuit of claim 1, wherein the first and second pulse generation components are implemented in hardware.

3. The circuit of claim 1, wherein the first and second pulse generation components are implemented using analog devices.

4. The circuit of claim 1, further comprising:
   an input component is coupled to the solar panel; and
   the input component includes first and second sample-and-hold components and first and second comparators; wherein,
   the first sample-and-hold component and the first comparator for generating a signal indicative of the change in voltage generated by the solar panel; and
   the second sample-and-hold component and the second comparator for generating a signal indicative of the change in current generated by the solar panel.

5. The circuit of claim 4, wherein the sample-and-hold component includes a capacitor.

6. The circuit of claim 1, wherein,
   the first pulse generation component includes a first voltage ramp signal generation circuit and a third comparator; wherein,
   the first ramp voltage generation circuit for generating a first voltage ramp signal having a peak value determined by the voltage generated by the solar panel; and
   the third comparator for generating the pulse signal for charging the capacitor based on the first voltage ramp signal and the current generated by the solar panel.

7. The circuit of claim 1, wherein,
   the second pulse generation component includes a second voltage ramp signal generation circuit and a fourth comparator; wherein,
   the second ramp voltage generation circuit for generating a second voltage ramp signal having a peak value determined by the change in voltage generated by the solar panel; and
   the fourth comparator for generating the pulse signal for discharging the capacitor based on the second voltage ramp signal and the change in current generated by the solar panel.

8. The circuit of claim 1, further comprising:
   an output component including first and second current sources, first and second switches and the capacitor; wherein,
   the pulse signal generated by the first pulse generation component for turning on the first switch;
   the first current source for charging the capacitor when the first switch is turned on;
   the pulse signal generated by the second pulse generation component for turning on the second switch; and
   the second current source for discharging the capacitor when the second switch is turned on; and
   the output component for generating the signal indicative of the MPP for the solar panel indicating an average voltage of the capacitor in steady state.

9. The circuit of claim 8, wherein,
   the first switch is turned on if the pulse signal generated by the first pulse generation component is in the high state;

the second switch is turned on if the pulse signal generated by the second pulse signal generation component is in the high state.

10. The circuit of claim 8, wherein the capacitor can be simultaneously charged and discharged.

11. The circuit of claim 1, wherein,
the circuit is implemented in a DC-DC converter;
the DC-DC converter is coupled to a DC-AC inverter; and
the DC-AC inverter is coupled to a load, wherein,
the signal generated by the capacitor is used to perform impedance matching for the load.

12. The circuit of claim 1, wherein the incremental amount by which the charge level of the capacitor changes decreases as the voltage and current generated by the solar panel approach the MPP for the solar panel.

13. The circuit of claim 1, wherein the solar panel can include one or more photovoltaic (PV) cells.

14. A method for determining and maintaining a maximum power point (MPP) for a solar panel, comprising:
monitoring the voltage and current generated by the solar panel;
generating a first pulse signal based on the voltage and current generated by the solar panel;
generating a second pulse signal based on the change in the voltage and current generated by the solar panel;
charging the capacitor by using the first pulse signal;
discharging the capacitor by using the second pulse signal; and
generating a reference signal indicative of the charge level of the capacitor.

15. The method of claim 14, wherein the reference signal is indicative of the MPP if the reference signal provides a steady signal level.

16. The method of claim 14, wherein the incremental amounts by which the voltage and current generated by the solar panel change decrease as the reference signal approaches the MPP for the solar panel.

17. The method of claim 14, wherein using the reference signal to perform impedance matching.

18. The method of claim 14, wherein simultaneously charging and discharging the capacitor.

19. A solar power generation system comprising:
a solar panel including one or more solar cells coupled to a circuit for tracking a maximum power point (MPP) for a solar panel;
the circuit coupled to a DC-DC converter;
the DC-DC converter coupled to a DC-AC converter; and
the DC-AC converter coupled to a power grid; wherein, the circuit comprises:
an input component for processing a first signal indicative of a voltage generated by the solar panel and a second signal indicative of a current generated by the solar panel;
the input component coupled to first and second pulse generation components;
the input component for generating a third signal indicative of a change in the first signal level and a fourth signal indicative of a change in the second signal level;
the input component for providing the third and fourth signals to the second pulse generation component;
the first pulse generation component for generating a fifth signal by using the first and second signals;
the second pulse generation component for generating a sixth signal by using the third and fourth signals;
an output component coupled to the first and second pulse generation components;
the first and second pulse generation components for providing the fifth and sixth signals to the output component;
the output component including a capacitor; and
the output component for generating a seventh signal indicative of the charge level of the capacitor; wherein,
the fifth and sixth signals including pulse signals;
the fifth signal for charging the capacitor; and
the sixth signal for discharging the capacitor.

20. The solar power generation system of claim 19, wherein the seventh signal is indicative of the MPP for the solar panel by indicating an average voltage of the capacitor in steady state.

21. A method for generating a reference voltage for a DC/DC converter operated off a solar panel, the reference voltage being representative of a maximum power point (MPP) of said DC/DC converter, the method comprising:
sensing a voltage and a current of the solar panel;
generating signals V and I representative of the voltage and the current of the solar panel, respectively;
generating signals $\Delta V$ and $\Delta I$ representative of a change of said V and I signals over time, respectively;
generating charging pulses with a first average that is proportional to a first ratio I divided by V;
generating discharging pulses with a second average that is proportional to a second ratio $\Delta I$ divided by $\Delta V$;
charging and discharging a capacitor with the said charging and discharging pulses; and
generating said reference voltage as a steady state average voltage of said capacitor.

22. The method of claim 21, and further comprising using the reference voltage to perform impedance matching for a load.

23. The method of claim 21, wherein charging and discharging the capacitor with said charging and discharging pulses occur simultaneously.

* * * * *